(12) United States Patent
Gou et al.

(10) Patent No.: US 10,412,698 B2
(45) Date of Patent: Sep. 10, 2019

(54) SYSTEM AND METHOD FOR IQ MISMATCH CALIBRATION AND COMPENSATION

(71) Applicant: Samsung Electronics Co., Ltd., Suwon-si, Gyeonggi-do (KR)

(72) Inventors: Tiangao Gou, San Diego, CA (US); Pranav Dayal, San Diego, CA (US); Niranjan Ratnakar, San Diego, CA (US); Gennady Feygin, San Diego, CA (US); Jungwon Lee, San Diego, CA (US)

(73) Assignee: Samsung Electronics Co., Ltd. (KR)

( * ) Notice: Subject to any disclaimer, the term of this patent is extended or adjusted under 35 U.S.C. 154(b) by 62 days.

(21) Appl. No.: 15/599,294

(22) Filed: May 18, 2017

(65) Prior Publication Data

US 2018/0242269 A1 Aug. 23, 2018

Related U.S. Application Data

(60) Provisional application No. 62/461,994, filed on Feb. 22, 2017.

(51) Int. Cl.
*H04W 56/00* (2009.01)
(52) U.S. Cl.
CPC ................. *H04W 56/004* (2013.01)
(58) Field of Classification Search
None
See application file for complete search history.

(56) References Cited

U.S. PATENT DOCUMENTS 5,159,565 A * 10/1992 Bune ................. H04L 25/03038
708/315
5,602,583 A * 2/1997 Citta ................. H04L 25/03343
348/21

(Continued)

OTHER PUBLICATIONS

Minn et al., "Pilot designs for channel estimation of ofdm systems with frquency-dependent i/q imbalances", Wireless Communications and Networking Conference, 2009, Aug. 23, 2010.

(Continued)

*Primary Examiner* — Edan Orgad
*Assistant Examiner* — Emmanuel K Maglo
(74) *Attorney, Agent, or Firm* — Innovation Counsel LLP

(57) ABSTRACT

A method for providing IQ mismatch (IQMM) compensation includes: sending a single tone signal at an original frequency; determining a first response of an impaired signal at the original frequency and a second response of the impaired signal at a corresponding image frequency; determining an estimate of a frequency response of the compensation filter at the original frequency based on the first response and the second response; repeating the steps of sending the single tone signal, determining the first response and the second response, and determining the estimate of the frequency response of the compensation filter by sweeping the single tone signal at a plurality of steps to determine a snapshot of the frequency response of the compensation filter; converting the frequency response of the compensation filter to a plurality of time-domain filter taps of the compensation filter by performing a pseudo-inverse of a time-to-frequency conversion matrix; and determining a time delay that provides a minimal LSE for the corresponding time domain filter taps.

16 Claims, 8 Drawing Sheets

(56) References Cited

U.S. PATENT DOCUMENTS

| | | |
|---|---|---|
| 7,133,657 B2 | 11/2006 | Kuenen |
| 7,570,923 B2 | 8/2009 | Kiss |
| 7,830,954 B2 | 11/2010 | Welz |
| 8,379,767 B2 | 2/2013 | Zhu |
| 8,385,457 B2 | 2/2013 | Laudel |
| 8,396,173 B2 | 3/2013 | Ling |
| 8,971,446 B2 | 3/2015 | Muhammad |
| 9,184,945 B2 | 11/2015 | Chen |
| 9,264,156 B2 | 2/2016 | Wilhelmsson |
| 9,281,907 B2 | 3/2016 | An |
| 2003/0118177 A1* | 6/2003 | Karakas .......... H04B 3/23 379/406.01 |
| 2005/0047536 A1* | 3/2005 | Wu ............. H04L 27/3863 375/346 |
| 2005/0254389 A1* | 11/2005 | Minemura ....... G11B 7/00458 369/59.22 |
| 2012/0076192 A1* | 3/2012 | Nervig ........... H04L 25/03171 375/232 |
| 2012/0218053 A1* | 8/2012 | Cook .............. H03H 15/023 333/166 |
| 2013/0243131 A1 | 9/2013 | An |
| 2016/0072520 A1* | 3/2016 | Pagnanelli ........ H03M 3/468 341/143 |
| 2016/0322982 A1* | 11/2016 | Pagnanelli ........ H03M 1/0626 |
| 2016/0373125 A1* | 12/2016 | Pagnanelli ........ H03M 3/404 |
| 2017/0005737 A1 | 1/2017 | Yang |

OTHER PUBLICATIONS

Lin et al., "Hybrid domain compensation for analog impairments in OFDM systems", Global Telecommunications Conference, 2008, Dec. 8, 2008.

* cited by examiner

SYSTEM AND METHOD FOR IQ MISMATCH CALIBRATION AND COMPENSATION

CROSS-REFERENCE TO RELATED APPLICATION(S)

This application claims the benefits of and priority to U.S. Provisional Patent Application Ser. No. 62/461,994 filed Feb. 22, 2017, the disclosure of which is incorporated herein by reference in its entirety.

TECHNICAL FIELD

The present disclosure relates generally to wireless communication systems, more particularly, to a system and method for a system and method for IQ mismatch calibration and compensation.

BACKGROUND

In an ideal frequency-modulated (FM) wireless communication receiver, an analog front end (FE) exhibits an identical amplitude and a phase response on in-phase (I) and quadrature (Q) branches. In practice, however, mismatches and imbalances between the I and Q branches are unavoidable due to operating conditions and imperfections caused by the components of the wireless communication receiver such as a mixer, an analog low pass filer, and an analog-to-digital converter (ADC). The mismatches and imbalances introduce an image signal at a mirror frequency of a baseband frequency that can interfere with a demodulation and/or modulation process of an original signal. The image signal can degrade the performance of the wireless communication receiver. To mitigate the IQ mismatches and imbalances, numerous IQ mismatch compensation (IQMC) techniques based on a digital signal processing (DSP) have been proposed.

The IQ mismatches and imbalances are dominant causes of radio frequency (RF) impairments in modern direct-conversion RF receivers. In a typical IQMC architecture, an adaptive filter can find filter coefficients by iteratively exploring a desired property based on an actual received signal. However, those filter coefficients that are obtained by the iterative process may not meet an increasingly demanding requirement for high data rates in emerging wireless communication applications.

SUMMARY

According to one embodiment, a method for providing IQ mismatch (IQMM) compensation includes: sending a single tone signal at an original frequency; determining a first response of an impaired signal at the original frequency and a second response of the impaired signal at a corresponding image frequency; determining an estimate of a frequency response of a compensation filter at the original frequency based on the first response and the second response; repeating the steps of sending the single tone signal, determining the first response and the second response, and determining the estimate of the frequency response of the compensation filter by sweeping the single tone signal at a plurality of steps to determine a snapshot of the frequency response of the compensation filter; converting the frequency response of the compensation filter to a plurality of time-domain filter taps of the compensation filter by performing a pseudo-inverse of a time-to-frequency conversion matrix; and determining a time delay that provides a minimal least square error (LSE) based on a plurality of LSEs for the corresponding time domain filter taps.

According to one embodiment, a method for providing IQ mismatch (IQMM) compensation includes: estimating filter coefficients corresponding to a plurality of filter taps of a compensation filter before reception of normal signals based on a static calibration scheme; setting each of the plurality of filter taps with a corresponding estimated filter coefficient; setting an initial value for a time delay tap to zero or based an estimated value obtained using the static calibration scheme; and estimating a filter coefficient for the time delay tap during reception of a normal signal based on an iterative scheme using an adaptive filter.

According to one embodiment, an apparatus includes: a signal generator for generating and sending a single tone signal at an original frequency; a compensator including a time delay and a plurality of time-domain filter taps; and a compensation logic for performing a static calibration of the compensator. The compensation logic is configured to: determine a first response of an impaired signal at the original frequency and a second response of the impaired signal at a corresponding image frequency; determine an estimate of a frequency response of a compensation filter at the original frequency based on the first response and the second response; repeat the steps of sending the single tone signal, determining the first response and the second response, and determining the estimate of the frequency response by sweeping the single tone signal at a plurality of steps to determine a snapshot of the frequency response of the compensation filter; convert the frequency response of the compensation filter to a plurality of time-domain filter taps of the compensation filter by performing a pseudo-inverse of a time-to-frequency conversion matrix; and determining a time delay that provides a minimal least square error (LSE) based on a plurality of LSEs for the corresponding time domain filter taps.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
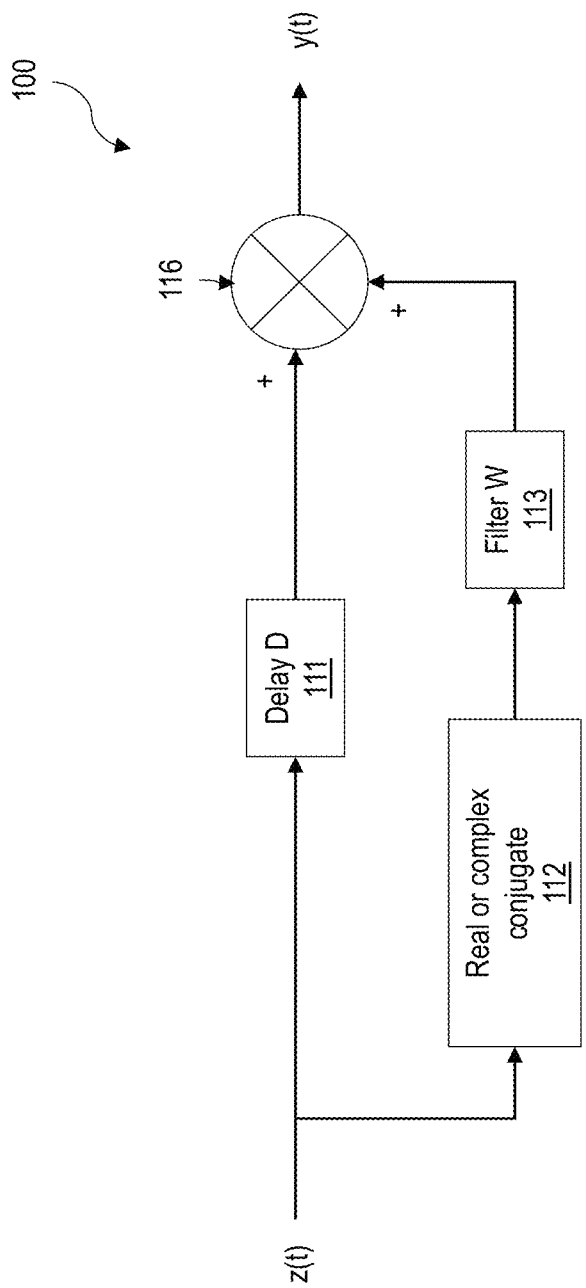
FIG. 1 illustrates an exemplary block diagram of an example IQMC system, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide an IQ mismatch calibration and compensation. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure provides an IQ mismatch compensation (IQMC) system and method that can mitigate an impact of an IQ mismatch and/or an IQ imbalance using digital signal processing (DSP) techniques. FIG. 1 illustrates an exemplary block diagram of an example IQMC system, according to one embodiment. The IQMC system 100 can be implemented as an independent signal receiver or a signal receiver integrated in a wireless communication transceiver.

In a time domain, the present IQMC system 100 receives an input signal z(t) (herein also referred to as a mismatched signal or an impaired signal) that includes mismatches and imbalances and generates a signal y(t) that can compensate the input signal z(t). The input signal z(t) is a complex impaired signal including a real part $z_i(t)$ and an imaginary part $z_q(t)$. The present IQMC system 100 includes a filter 113, an operational block 112 that operates on the input signal z(t), a delay block 111 applied to the input signal z(t) on a main path, and an adder block 116 that adds the signals output from the delay block 111 and the filter 113.

According to one embodiment, the operational block 112 is a complex conjugate unit that takes a complex conjugate of the input signal z(t). In another embodiment, the operational block 112 is a real unit that takes a real part of the input signal z(t). In some embodiments, the complexity of the conjugate operation performed by the operational block 112 can be reduced by taking just the real part of the input signal z(t). The output of the operational block 112 is fed to the filter 113 as an input.

According to one embodiment, the IQMC system 100 can include a complex-valued compensator (CVC) that uses a complex-valued compensation filter. For example, the input signal z(t) can be a complex-valued signal including a real part $z_i(t)$ and an imaginary part $z_q(t)$, and the filter 113 can be a complex-valued compensation filter.

The output signal from the filter 113 is fed to the adder block 116 that combines the filtered signal with the delayed input signal (i.e., z(t−D)) to generate the compensated signal y(t). Regardless of whether the complex conjugate of the input signal z(t) or the real part of the input signal z(t) is used, the present IQMC system 100 uses a CVC because the filter 113 is a complex-valued filter.

According to one embodiment, the present IQMC system 100 can be parameterized by a number of the delay D (for example, delay 2 indicates a delay of two samples) and a number of filter taps N (N being a number of filter coefficients) in the filter 113. In general, an optimal delay may grow as the number of filter taps N in the filter 113 increases. The present IQMC system 100 determines filter coefficients given the number of filter taps N in the filter 113 and an optimal delay of the delay block 111.

According to one embodiment, the present IQMC system 100 can provide an IQ mismatch calibration to determine the optimal delay D and the optimal filter coefficients of the filter 113. In one embodiment, the present IQMC system 100 employs a sequence of single tone training signals with a baseband frequency to determine the optimal filter coefficients for a given delay D. The baseband frequency refers to the original frequency of the received signal. The original signal can occupy a frequency band of a certain size, for example, 20 MHz. The sequence of signal tone training signals can be located within the frequency range sampling discrete frequencies within the frequency range, for example, 1 MHz granularity. The filter coefficients can be estimated by sweeping the single tone training signals. In a time domain, the compensated signal y(t) can be expressed as a function of the input signal z(t) with a delay D and a filter coefficient w(t):

$$y(t)=z(t-D)+w(t)*\text{real}\{z(t)\}. \quad \text{(Eq. 1)}$$

In Eq. 1, a real unit is used as the operational block 112 as an example, a complex conjugate unit can be used without deviating from the scope of the present disclosure.

Figure 2:
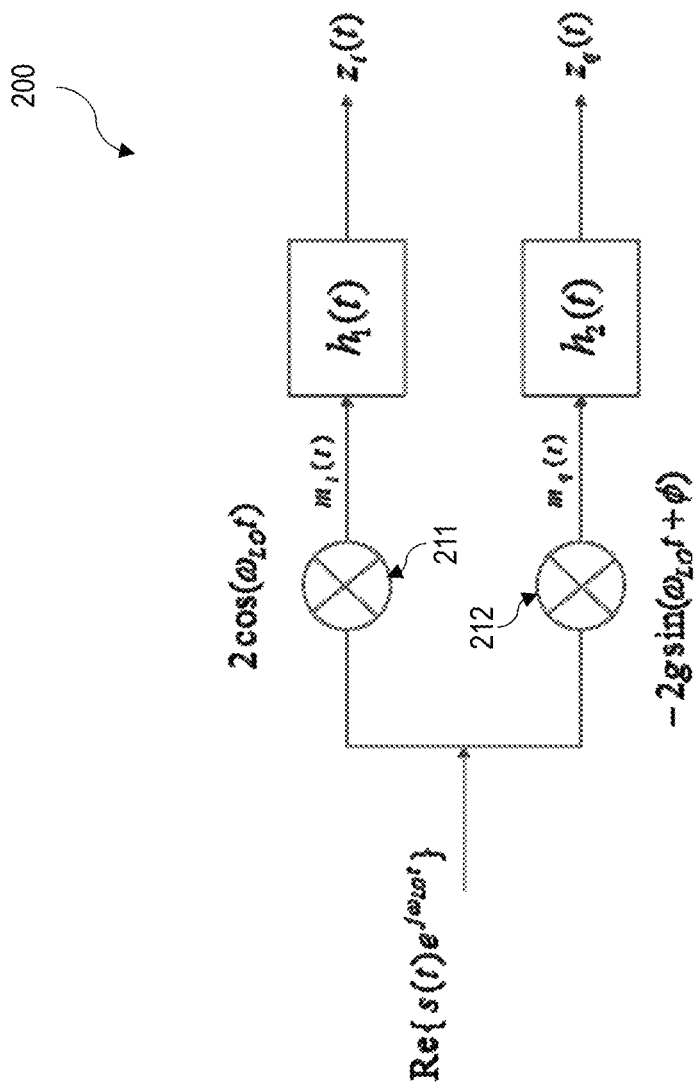
FIG. 2 illustrates an exemplary diagram of an IQ mismatch model (IQMM), according to one embodiment.

FIG. 2 illustrates an exemplary diagram of an IQ mismatch model (IQMM), according to one embodiment. The IQMM shown in FIG. 2 is based on I/Q down-conversion. The output of the IQMM is fed to the IQMC system 100 of FIG. 1. The IQMM 200 can demodulate and split a received signal s(t) into in-phase (I) and quadrature (Q) signals paths. Each of the I and Q paths includes a mixer (211 and 212 respectively) and an analog filter ($h_1(t)$ and $h_2(t)$). The mixers 211 and 212 output down-converted signals $m_i(t)$ and $m_q(t)$ on the I and Q paths, respectively using a local oscillator (LO) whose frequency is $\omega_{LO}$. The down-converted signals $m_i(t)$ and $m_q(t)$ are filtered by the analog filters $h_1(t)$ and $h_2(t)$ to generate the output signals $z_i(t)$ and $z_q(t)$ respectively on the I and Q paths. The signals on the I and Q paths can introduce mismatches and imbalances including: 1) mismatches of a gain g and a phase $\phi$ at the mixers 211 and 212 and 2) overall frequency responses of the analog filters $h_1(t)$ and $h_2(t)$.

The present IQMM can be either a frequency independent (FI)-IQMM or a frequency dependent (FD)-IQMM. The IQMM shown in FIG. 2 can be either the FI-IQMM or the FD-IQMM. The FI-IQMM can be applied to a signal having a non-unity gain $g \neq 1$ and a non-zero phase $\phi \neq 0$. The FD-IQMM can include analog filters $h_1(t)$ and $h_2(t)$, where $h_1(t)$ is an impulse response of an analog filter along the I path, and $h_2(t)$ is an impulse response of an analog filter along the Q path.

The received signal s(t) that is demodulated and split into I and Q paths can include a desired original signal, and an image signal representing a gain and/or phase imbalance introduced onto the desired original signal as a result of signal processing by the mixers 211 and 212 and the analog filters $h_1(t)$ and $h_2(t)$ of the IQMM 200. The present IQMC system attempts to minimize the impact of the image signal.

The mismatched signal z(t) of the IQMM 200 can be expressed as a function of the received signal s(t) and an image signal s*(t). For example, the mismatched signal z(t) can be expressed as:

$$z(t)=g_1(t)*s(t)+g_2(t)*s*(t), \quad \text{(Eq. 2)}$$

where $$g_1(t)=(h_1(t)+ge^{-j\phi}h_2(t))/2$$

$$g_2(t)=(h_1(t)-ge^{j\phi}h_2(t))/2 \quad \text{(Eq. 3)}.$$

$g_1(t)$ and $g_2(t)$ denote complex scaling factors for the received signal s(t) and the image signal s*(t). For example, the scaling factor $g_1(t)$ is an impulse response of the effective filter that the original signal passes through, and the scaling factor $g_2(t)$ is an impulse response of the effective filter that the image signal that is introduced by the IQ mismatch passes through. The mismatched signal z(t) of Eq. 2 can be represented in an equation of a frequency domain using a Fourier transform:

$$Z(f)=G_1(f)S(f)+G_2(f)S*(-f), \quad \text{(Eq. 4)}$$

where $$G_1(f) = \frac{H_1(f) + ge^{-j\phi}H_2(f)}{2} \quad \text{(Eq. 5)}$$

$$G_2(f) = \frac{(H_1(f) - ge^{j\phi}H_2(f))}{2}.$$

Referring to the present IQMC system shown in FIG. 1, the compensated signal y(t) can be expressed in terms of the complex scaling factors $g_1(t)$ and $g_2(t)$, the received signal s(t) and the image signal s*(t) as:

$$y(t) = z(t-D) + w(t)*\text{real}\{z(t)\} = \quad \text{(Eq. 6)}$$
$$\left(g_1(t-D) + \frac{1}{2}w(t)*(g_2^*(t)+g_1(t))\right)*s(t) +$$
$$\left(g_2(t-D) + \frac{1}{2}w(t)*(g_1^*(t)+g_2(t))\right)*s^*(t).$$

From Eq. 6, the optimal filter coefficient w(t) that can completely cancel the image signal s*(t) can be obtained by forcing $$g_2(t-D) + \frac{1}{2}w(t)*(g_1^*(t)+g_2(t)) = 0.$$

This leads to an optimal filter coefficient $W_{OPT}(f)$ in a frequency domain:

$$W_{OPT}(f) = -\left(\frac{2G_2(f)}{G_1^*(-f)+G_2(f)}\right)e^{-j2\pi fD} \quad \text{(Eq. 7)}$$
$$= \left(-1 + ge^{j\phi}\frac{H_2(f)}{H_1(f)}\right)e^{-j2\pi fD}.$$

Figure 3:
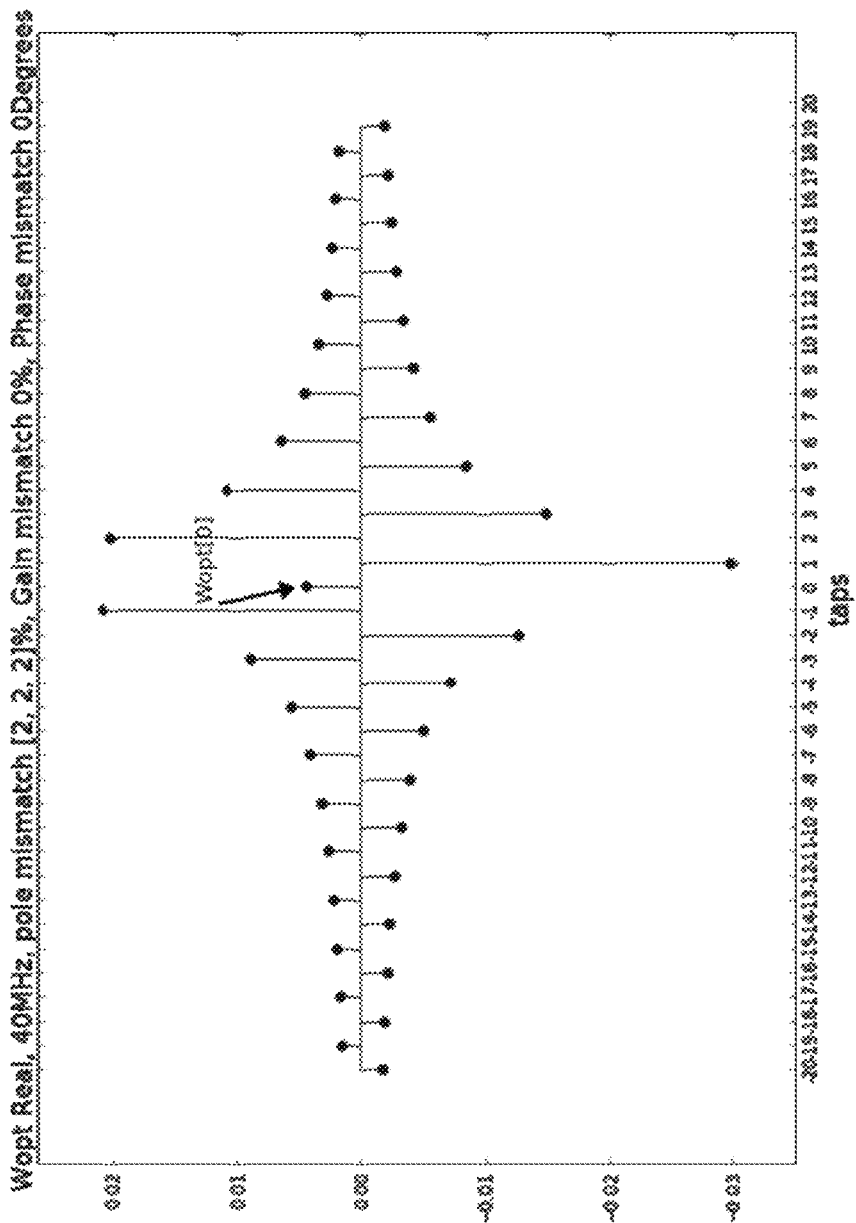
FIG. 3 illustrates an exemplary plot of a non-causal filter coefficients of a non-causal filter, according to one embodiment.

In the example of the IQMM shown in FIG. 2, the optimal filter is a non-causal filter with a large number of filter taps. A causal filter has zero values at negative indices of filter taps. In contrast, a non-causal filer can have non-zero values at negative indices of filter taps. FIG. 3 illustrates an exemplary plot of filter coefficients of a non-causal filter, according to one embodiment.

According to one embodiment, the present IQMM is based on a pole mismatch between two third-order Butterworth filters on the I and Q paths. The example in FIG. 3 shows filter taps that span from −20 to 20 of a complex-valued optimal filter showing only the real part. The optimal filter corresponds to an IQMM model with a 40 MHz third-order Butterworth filter with a pole mismatch [2%, 2%, 2%], a gain mismatch 0%, and a phase mismatch of 0 degree. The negative filter taps have non-zero values; therefore, the filter is a non-causal filter.

Figure 4:
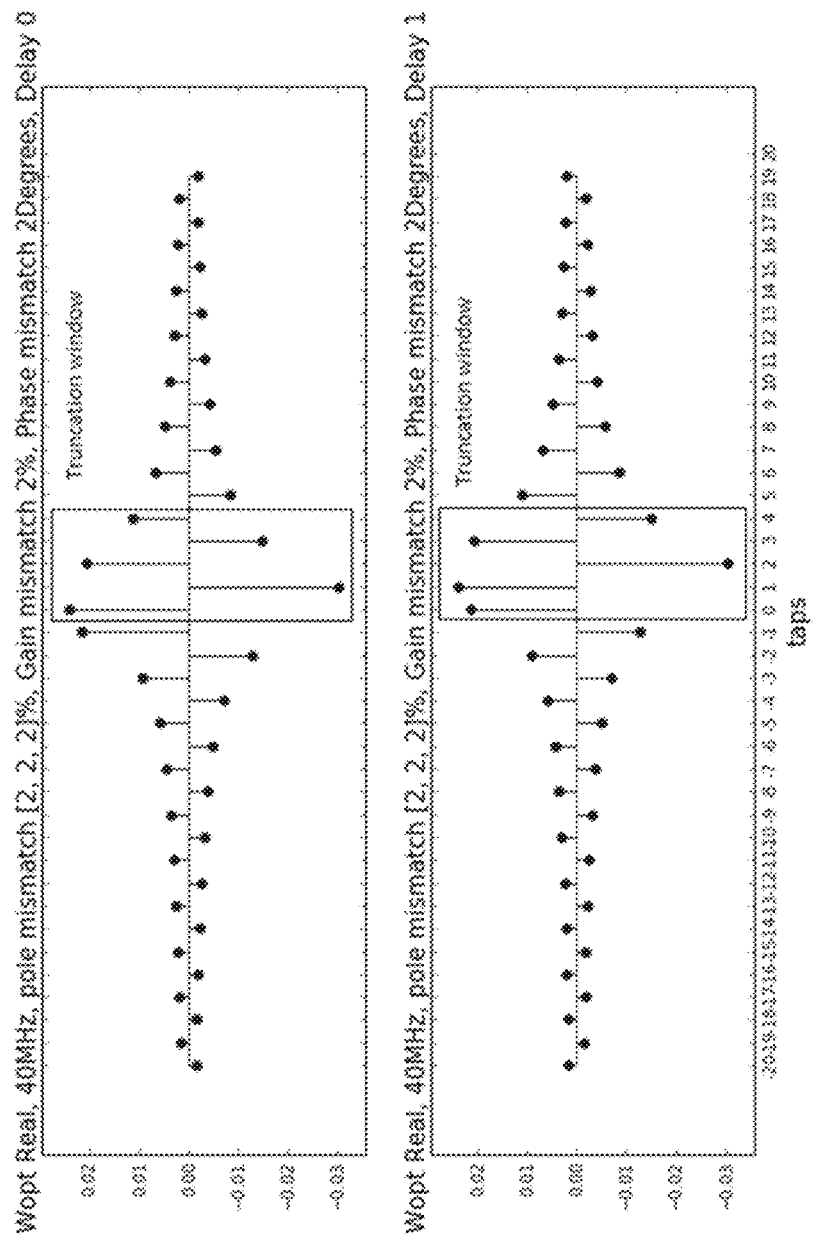
FIG. 4 illustrates exemplary plots of filter coefficients of a causal filter, according to one embodiment.

According to one embodiment, the optimal filter is approximated with a causal filter with a finite number of filter taps. Herein, the optimal filter may refer to a causal optimal filter with a finite number of filter taps that is an approximate of the non-causal optimal filter with a large number of filter taps. When approximating the optimal filter $W_{OPT}$ with a finite number of filter taps, one or more negative taps can be included. FIG. 4 illustrates exemplary plots of filter coefficients of a causal filter, according to one embodiment.

In the case of a causal filter, the optimal filter can be approximated with a finite impulse response (FIR) filter by truncating the optimal filter by selecting only a finite number of filter taps N. The FIR filter has a finite number of taps. The FIR filter can be a non-causal filter if there is at least one negative tap. In the example shown in FIG. 4, the FIR filter without a delay includes the filter taps 0 to 4 that have large energy/magnitude excluding the negative taps. However, it is observed that the filter tap −1 of the optimal filter has a magnitude that is larger than a magnitude of the filter tap 4. In this case, one can include the filter tap −1. In order to select the filter tap −1, an extra delay can be introduced on a feedthrough path (e.g., in the delay block 111) such that the filter taps −1 through 3 are all effectively shifted right by 1 unit to occupy the filter tap 0 through 4. The unit herein refers to the number of sample, and its value is the same value as the value of the delay D samples introduced in the delay block 111 of FIG. 1. Thus, the extra delay can improve the filtering performance of the optimal filter. In this case, impairment parameters of the IQMM are assumed to be known so that the FIR approximation of the optimal filter can be determined based on the IQMM impairment parameters. In practice, however, the impairment parameters of the IQMM may not be available a priori, and a training scheme may be used to obtain the impairment parameters.

According to one embodiment, the present IQMC system can estimate filter coefficients of the compensator filter using one or more pilot single tone signals. For example, the present IQMC system provides training-based IQMC calibration using one or more pilot single tone signals. The training-based IQMC calibration starts with sending a single tone signal at a selected frequency within the frequency range of the desired signal. The present IQMC system observes and analyzes responses of the impaired signal (i.e., received signal without compensation) at both an original frequency of a received signal and the image frequency. Based on the responses at both the original frequency and the image frequency, the present IQMC system can estimate a response of the compensator filter at other frequencies as well. The present IQMC system can sweeps the single tone over a range of frequencies at certain steps to obtain a snapshot of the frequency response of the compensator filter over the range of frequencies. The present IQMC system converts the frequency response of the compensator filter to time domain taps by performing a pseudo-inverse of a time-to-frequency conversion matrix. The present IQMC system can check the frequency responses of the compensation filter by applying different delays with the same set of single tone signals.

According to one embodiment, the present IQMC system generates K continuous-time single tone signals at a selected frequency $f_{p_k}$. The selected frequency $f_{p_k}$ can be a multiple of subcarriers spacing, according to one embodiment. For each $k \in \{1, \ldots, K\}$, using discrete time Fourier transform (DTFT), the present IQMC system uses a discrete time Fourier transform (DTFT) to determine a frequency component of the received time domain signal z(t) at normalized frequencies $f_{p_k}/f_s$ and $-f_{p_k}/f_s$ that are denoted as $Z(f_{p_k}/f_s)$ and $Z(-f_{p_k}/f_s)$. The sampling frequency at a point where the received signal is processed is denoted as $f_s$:

$$Z\left(\frac{f}{f_s}\right) = \Sigma_{m=0}^{M-1} z(m) e^{-j2\pi \frac{f}{f_s} m}. \quad \text{(Eq. 8)}$$

The following quantity is determined by:

$$-\frac{2Z\left(-\frac{f_{p_k}}{f_s}\right)}{Z^*\left(\frac{f_{p_k}}{f_s}\right) + Z\left(-\frac{f_{p_k}}{f_s}\right)} = W'(-f_{p_k}). \quad \text{(Eq. 9)}$$

For each $D \in \{0, \ldots, N-1\}$, the present IQMC system determines:

$$W_D(-f_{p_k}) = W'(-f_{p_k}) e^{-j2\pi D\left(-\frac{f_{p_k}}{f_s}\right)}. \quad \text{(Eq. 10)}$$

By denoting $W' = [W'(-f_{p_1}), W'(-f_{p_K})]^T$, $W_D = [W_D(-f_{p_1}), \ldots, W_D(-f_{p_K})]^T$, and $$D = \text{diag}\left(e^{-j2\pi D\left(-\frac{f_1}{f_s}\right)}, \ldots, e^{-j2\pi D\left(-\frac{f_K}{f_s}\right)}\right),$$

this step can be also written in the following matrix form:

$$W_D = DW'. \quad \text{(Eq. 11)}$$

A K×N discrete time Fourier (DFT) matrix is denoted as F, whose entries are given by:

$$F_{k,n} = e^{-j2\pi\left(-f_{p_k}/f_{s_{iqmc}}\right)^n}, \text{ where} \quad \text{(Eq. 12)}.$$

$$k \in \{1, \ldots, K\} \text{ and } n \in \{0, \ldots, N-1\},$$

$f_{s_{iqmc}}$ is an operating frequency at which the present IQMC operates.

According to one embodiment, the present IQMC system precomputes and stores a pseudo inverse of the DFT matrix F as:

$$\text{pinv}(F) = (F^H F)^{-1} F^H. \quad \text{(Eq. 13)}$$

The present IQMC system loads the pseudo inverse of the DFT matrix F and computes the N-tap FIR approximation $w_{opt,N,D}$ of the optimal filter as:

$$w_{opt,N,D} = \text{pinv}(F) W_D = \text{pinv}(F) DW'. \quad \text{(Eq. 14)}$$

In another embodiment, the present IQMC system pre-computes pinv(F)D for every delay D and loads the product altogether to avoid computing a matrix product of three matrices pinv(F), D, and W'. For each $w_{opt,N,D}$, the present IQMC system can compute a least square error that is defined as:

$$LSE_D = \|W_D - Fw_{opt,N,D}\|^2. \quad \text{(Eq. 15)}$$

The present IQMC system selects an optimal delay D that yields the minimal least square error (LSE) using the following equation:

$$D = \arg\min_D LSE_D. \quad \text{(Eq. 16)}$$

In this case, the least square error between the desired frequency response and the frequency response of the designed filter is a metric used to select the optimal delay D.

In an ideal condition, a static calibration scheme can find all filter coefficients for a given tuple of parameters including a signal bandwidth, a frequency band, and a frequency channel. However, in practice, the number of possible combinations of these three parameters are so large, and the number of static calibrations for each combination is greatly limited. In order to reduce the complexity, a static calibration scheme may be performed for each possible signal bandwidth with one arbitrarily chosen pair of frequency band and frequency channel. It is noted that the present static calibration scheme can compensate for both FI-IQMM and FD-IQMM for a given a band, channel, signal bandwidth configuration. FI-IQMM is varying across band/channel, so FI-IQMM may not be practical to apply the present static calibration scheme for all possibilities of the three parameters. A hybrid calibration scheme will be described with respect to the following examples.

According to one embodiment, the present IQMC system can perform a static calibration for each bandwidth to determine all but one filter coefficient. The one filter coefficient corresponds to the value of the tap D, and the tap D is the delay value used in delay block 111 in FIG. 1. In this embodiment, the present IQMC system determines the filter coefficient for tap D that may change across band/channel based on an adaptive process. The adaptive process uses the normal received signal instead of a single tone training signal. The adaptive process finds the value of the tap D given a chose number of filter taps and a delay value D. The present IQMC system can determine the improvements of the original filter coefficients that are obtained by the static calibration scheme based on a convergence of the remaining filter coefficients. It is known that the convergence is guaranteed for commercial wireless standards such as LTE, 3G, and Wi-Fi.

The FD-IQMM is not channel/band dependent because the FD-IQMM is mainly introduced by a mismatch between two analog filters that is only bandwidth dependent but not channel or band dependent. On the other hand, the FI-IQMM is channel/band dependent because the FI-IQMM is mainly introduced at a mixer that is channel/band dependent. Based on these observations, the present IQMC system separates the compensation of the FI-IQMM and the FD-IQMM.

According to one embodiment, a ratio of the analog filters $$\frac{H_2(f)}{H_1(f)}$$

is defined as $H_d(f)$, and its time-domain impulse response is defined as $h_d(n)$. The time-domain response $w_{opt}(t)$ of $W_{opt}(f)$ can be expressed as:

$$w_{opt}(n) = -\delta(t-D) + ge^{j\phi}h_d(n-D). \quad \text{(Eq. 17)}$$

For the filter tap D, it mainly depends on the FI-IQMM:

$$w_{opt}(D) = -1 + ge^{j\phi}h_d(0) \approx -1 + ge^{j\phi}. \quad \text{(Eq. 18)}$$

For other taps, if the filter coefficients can be obtained in a training channel by:

$$w_{opt_{train}}(n) = g^{train}e^{j\phi_{train}}h_d(n-D), n \neq D, \quad \text{(Eq. 19)}$$

the time-domain response $w_{opt}(t)$ can depend on both the FI-IQMM and the FD-IQMM. Herein, the training channel refers to an arbitrarily chosen band and an arbitrarily chosen channel for a specific wireless standard (e.g., LTE, 3G, and Wi-Fi). The time-domain response $w_{opt_{train}}(n)$, $n \neq D$ may be applied to other test channels. In this case, the actual coefficients for $n \neq D$ in the test channel can be given by:

$$w_{opt_{test}}(n) = g_{test}e^{j\phi_{test}}h_d(n-D), n \neq D. \quad \text{(Eq. 20)}$$

As a result, an error in the form of a ratio between the actual value and the applied value can be expressed by:

$$r_e = \frac{w_{opt_{test}}(n)}{w_{opt_{train}}(n)} = \frac{g_{test}e^{j\phi_{test}}h_d(n-D)}{g_{train}e^{j\phi_{train}}h_d(n-D)} = \frac{g_{test}e^{j\phi_{test}}}{g_{train}e^{j\phi_{train}}}, n \neq D. \quad \text{(Eq. 21)}$$

If the FI-IQMM does not change too much, the error may not be large, and the performance may be acceptable. If the error is large, the error may be compensated as follows:

$$w_{opt_{train}}(D) + 1 = g_{train}e^{j\phi_{train}}h_d(0) \text{ and}$$

$$w_{opt_{test}}(D) + 1 = g_{test}e^{j\phi_{test}}h_d(0). \quad \text{(Eq. 22)}$$

It is observed that the error $r_e$ can be estimated from $w_{opt_{train}}(D)$ and $w_{opt_{test}}(D)$ as:

$$\hat{r}_e = \frac{w_{opt_{test}}(D) + 1}{w_{opt_{train}}(D) + 1} = \frac{g_{test}e^{j\phi_{test}}h_d(0)}{g_{train}e^{j\phi_{train}}h_d(0)} = \frac{g_{test}e^{j\phi_{test}}}{g_{train}e^{j\phi_{train}}} = r_e. \quad \text{(Eq. 23)}$$

From $\hat{r}_e$ and $w_{opt_{train}}(n)$, $w_{opt_{test}}(n)$ may be obtained as follows. According to one embodiment, given selected filter taps N and a delay D, the present IQMC system estimates all filter coefficients before the reception of normal signals using a pilot-based scheme. In one embodiment, the present IQMC system estimates the filter coefficients using a static calibration scheme employing a sequence of single tone training signals as described above.

The present IQMC system further sets all filter taps except the filter tap D with the estimated filter coefficient values. An initial value of the filter tap D may be set in several ways. In one embodiment, the present IQMC system sets the filter tap D value to be 0. In another embodiment, the present IQMC system sets the filter tap D value to an estimated value obtained using the pilot-based scheme. The filter tap D that is estimated based on the pilot-based scheme can shorten a convergence time to determine the optimal filter coefficients. Here, the filter coefficients may be denoted as $w_{opt,N_{train}}(0), \ldots, w_{opt,N_{train}}(N-1)$.

During the reception of a normal signal, the present IQMC system performs an adaptive process only for the filter tap D as described below:

Input/Output Signal $$z(n), y(n)$$

Parameters $$Z(n)=[z(n)z(n-1) \ldots z(n-N+1)]^T$$

$$Y(n)=[y(n)y(n-1) \ldots y(n-N+1)]^T$$

$$W(n)=[w_0(0) \ldots w_D(n) \ldots w_{N-1}(0)]^T$$

Step Size: μ
For n=0, 1, . . .

$$y(n)=z(n-D)+W^T(n)\text{real}(Z(n)) \text{ or } y(n)=z(n-D)+W^T(n)Z^*(n)$$

Update $w_D(n+1)=w_D(n)-\mu y(n-i)y(n-i)$, for any $i \in \{0, \ldots, N-1\}$

According to one embodiment, after the filter tap D is converged to $w_{ada_{test}}(D)$, the present IQMC system may further determine a correction factor $\hat{r}_e$ as follows:

$$\hat{r}_e = \frac{w_{ada_{test}}(D)+1}{w_{opt,N_{train}}(D)+1}. \quad (\text{Eq. 24})$$

The present IQMC system can then update all other filter taps as follows:

$$w_{test}(n)=\hat{r}_e \cdot w_{opt,N_{train}}(n), n \neq D. \quad (\text{Eq. 25})$$

Figure 5:
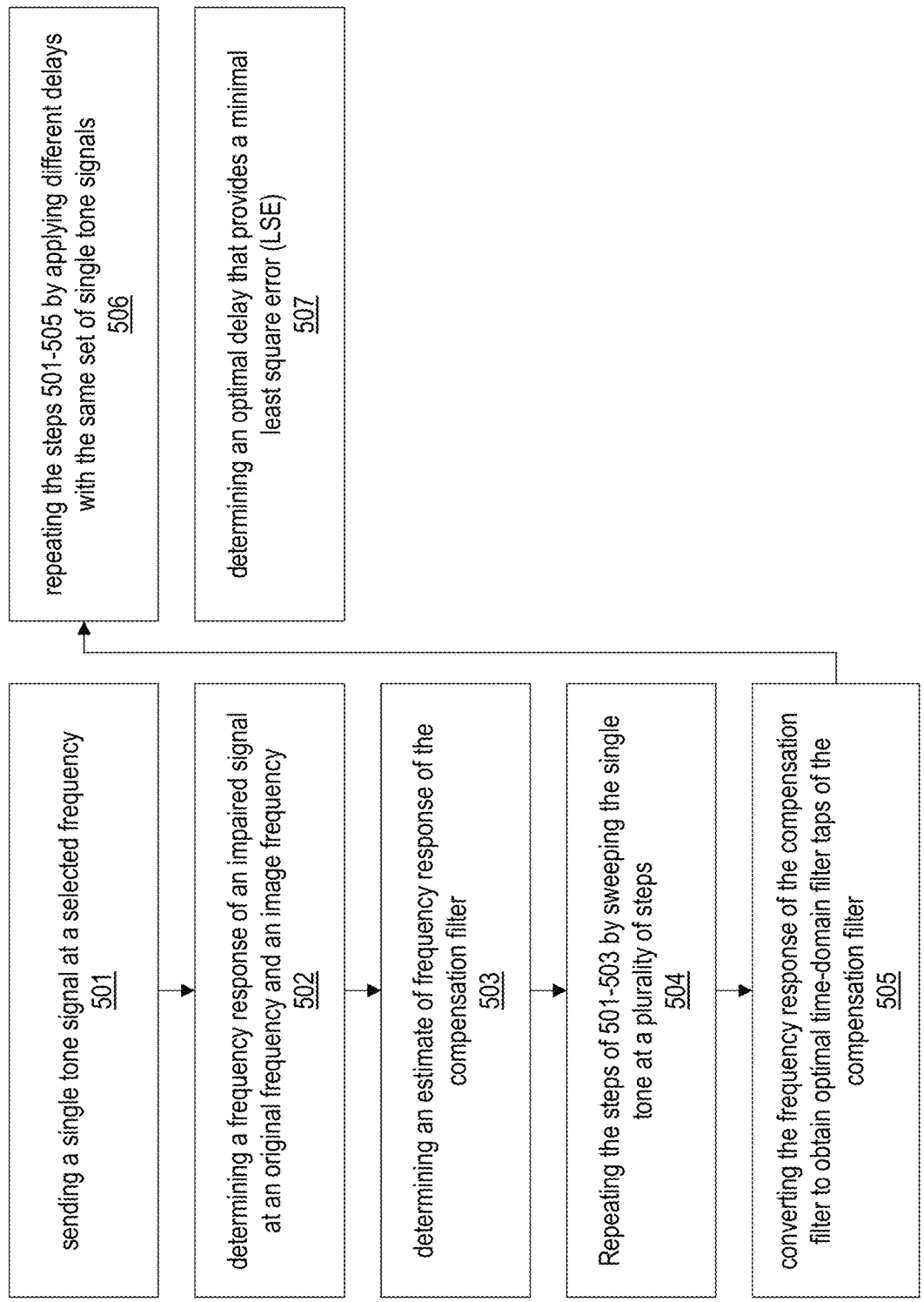
FIG. 5 shows a flowchart of a training-based calibration scheme, according to one embodiment.

FIG. 5 shows a flowchart of a training-based calibration scheme, according to one embodiment. According to one embodiment, the present IQMC system provides a training-based calibration scheme for calibrating a compensator filter. First, the present IQMC system sends a single tone signal at a selected frequency (at 501). The present IQMC system determines a frequency response of an impaired signal at an original frequency and a corresponding image frequency (at 502). The present IQMC system determines an estimate of a frequency response of the compensation filter based on the frequency response at the original frequency and the image frequency (at 503). The present IQMC system repeats the calibration steps performed in 501-503 by sweeping the single tone at a plurality of steps (multiples of subcarriers spacing) to obtain a snapshot of the frequency response of the compensation filter (at 504). The present IQMC system converts the frequency response of the compensation filter to determine optimal time-domain filter taps of the compensation filter (at 505). For example, the present IQMC system performs a pseudo-inverse of a time-to-frequency conversion matrix for the frequency-to-time domain conversion. The present IQMC system repeats the static calibration steps performed in 501-505 by applying different delays with the same set of single tone signals and check the frequency responses of the impaired signal (at 506). The present IQMC system then determines an optimal delay that provides a minimal least square error (LSE) for the corresponding time-domain filter taps (at 507). The present training-based calibration scheme can effectively compensate mismatches and imbalances of a FD-IQMM, and the same baseband filtering can be applied across channels for a given bandwidth. Furthermore, the training-based calibration scheme can compensate mismatches and imbalances of a FI-IQMM.

The present IQMC system may further compensate FI-IQMM that varies across channels due to changes in mixer setting. Before the reception of normal signals, the present IQMC system estimates filter coefficients for a plurality of filter taps N based on the above-described training based calibration scheme. It is appreciated that the present IQMC system may use other pilot-based static calibration schemes without deviating from the scope of the present disclosure. The present IQMC system sets all N filter taps with corresponding estimated filter coefficients (these filter coefficients do not change across band/channel), sets an initial value for delay tap D based on value 0 or an estimated value obtained using the pilot-based static calibration scheme, and estimates a filter coefficient (this filter coefficient changes across band/channel) for delay tap D during reception of normal signal based on an adaptive filter based iterative scheme. The present IQMC system can further improve the estimated filter coefficients for all N filter taps using a converged filter coefficient for delay tap D.

Figure 6:
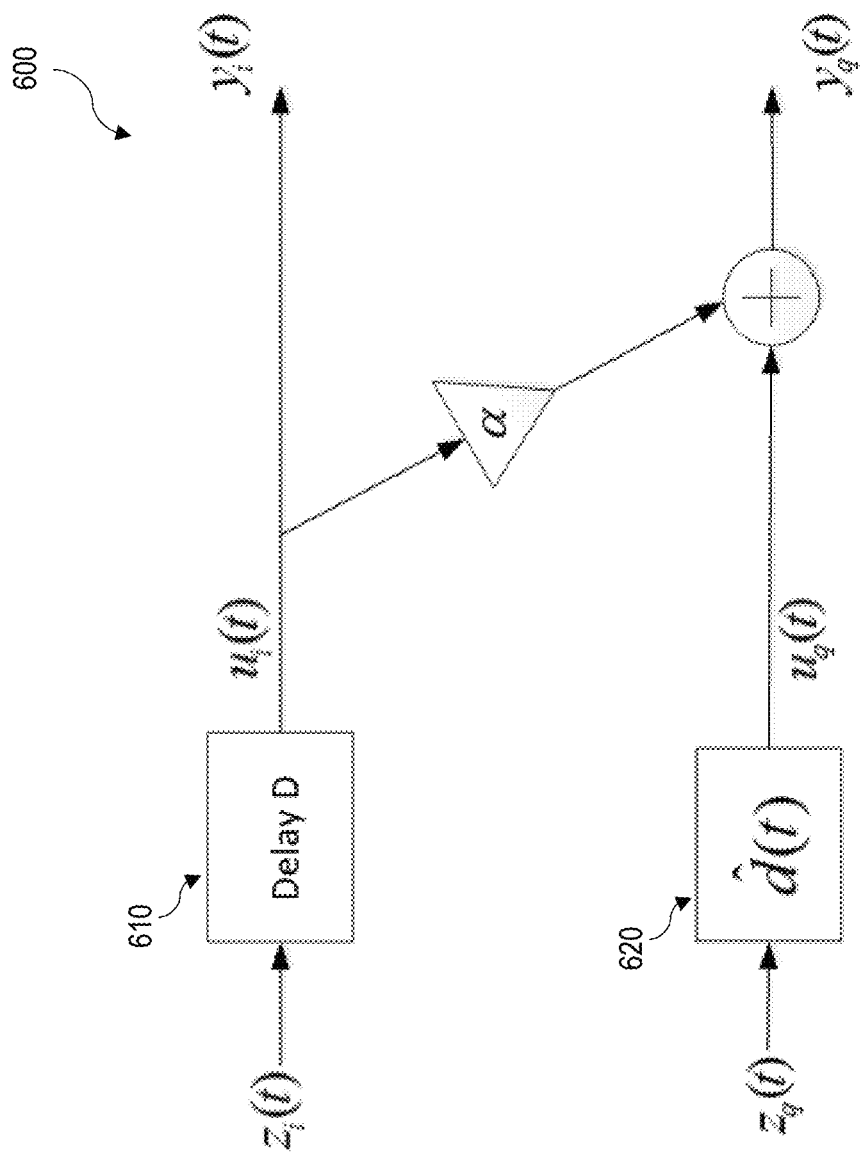
FIG. 6 shows an example real-valued filter, according to one embodiment.

According to some embodiments, the present IQMC system uses a real-valued filter. FIG. 6 shows an example real-valued filter, according to one embodiment. The real-valued filter can apply different filtering schemes on the Q and I paths. $u_i(t)$ and $u_q(t)$ are a pair of the impaired signal. The impaired signal is a partially compensated signal, and y(t) is the finally compensated signal. The compensation occurs at two stages. The first stage is used to compensate FD-IQMM, and the gain mismatch part of FI-IQMM. The second stage is used to compensate the phase mismatch part of FI-IQMM. The real-valued filter includes a real-valued scaling factor that feeds a delayed version of an in-phase (I) path into an output of a real-valued filter of a quadrature (Q) path.

The performance of the real-valued filter 600 can match the performance of the complex-valued filter in a similar setup with appropriate adjustment of the filtering scheme. Moreover, the real-valued filter 600 has a simpler structure compared to a complex-valued filter. The simple structure of the real-valued filter can reduce a gate count of a compensator block.

Figure 7:
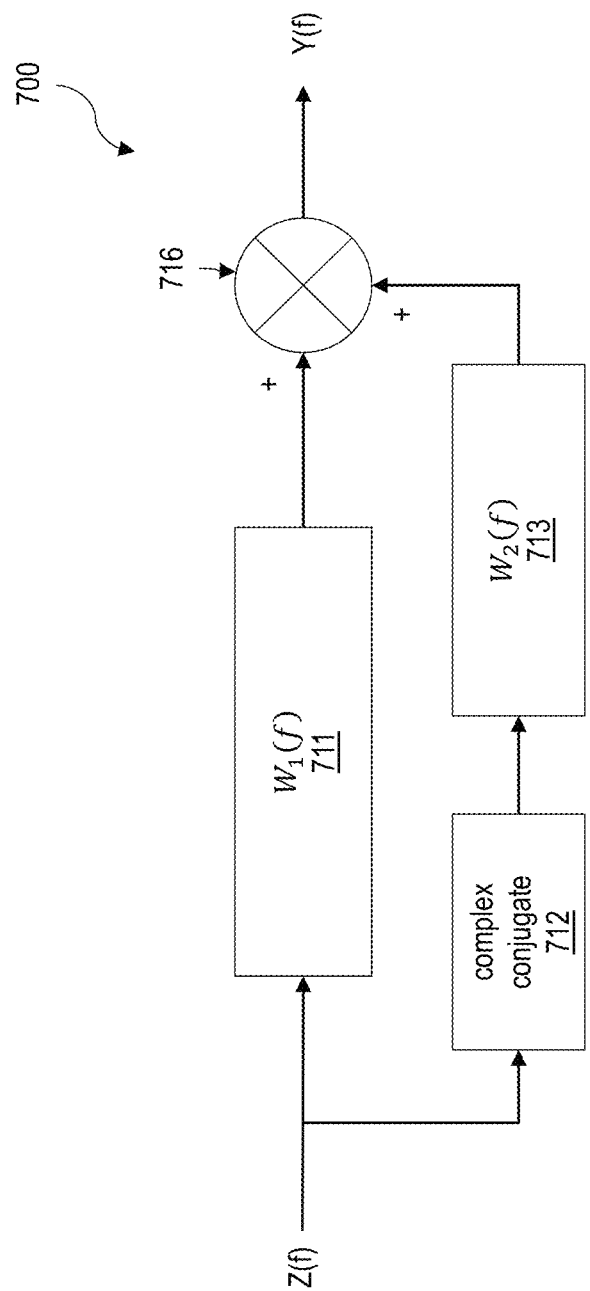
FIG. 7 shows a block diagram of an example complex-valued IQMC system, according to one embodiment.

FIG. 7 shows a block diagram of an example complex-valued IQMC system, according to one embodiment. The functional blocks of the complex-valued IQMC system 700 include a first complex-valued filter 711 on a main path, a second complex-valued filter 713 on a feedthrough path, an operational block 712 that operates on the input signal Z(f), and an adder block 716 that adds the signals output from the first complex-valued filter 711 and the second complex-valued filter 713. The mapping of the real-valued compensator and the complex-valued compensator is based on a mathematical relationship between the impaired signal and the compensated signal. In an actual implementation, these two compensators can be completely different. FIG. 1 shows the complex-valued compensator while FIG. 6 shows the real-valued compensator.

The complex-valued IQMC system 700 can be implemented as a signal receiver in a wireless communication system. The present complex-valued IQMC system 700 is expressed in terms of a frequency domain. For example, the mismatched signal is denoted as Z(f) (herein also referred to as an impaired signal) as an input to generate a compensated signal Y(f). The present complex-valued IQMC system 700 is expressed as an equivalent of a complex-valued IQMC system 100 shown in FIG. 1 including complex-valued filters 711 and 713. The operational block 712 is a complex conjugate unit that takes a complex conjugate of the input signal Z(f).

In a time-domain, the discrete compensated signal y[k] at the output of the real-valued compensator is expressed as:

$$y[k] = u_I[k - T_D] + j(\alpha u_I[k - T_D] + u_Q[k] * \hat{d}[k]) \quad \text{(Eq. 26)}$$

$$= \frac{1}{2}(u[k - T_D] + u^*[k - T_D]) + j\left(\frac{\alpha}{2}(u[k - T_D] + u^*[k - T_D]) + \frac{1}{2j}(u[k] - u^*[k]) * \hat{d}[k]\right)$$

$$= \left(\frac{1 + j\alpha}{2}\delta[k - T_D] + \frac{1}{2}\hat{d}[k]\right) * u(k) + \left(\frac{1 + j\alpha}{2}\delta[k - T_D] - \frac{1}{2}\hat{d}[k]\right) * u^*(k)$$

$$= w_1[k] * u(k) + w_2[k] * u^*(k)$$

In a frequency domain, the compensated signal is expressed as:

$$Y(f) = \left(\frac{1 + j\alpha}{2}e^{-j2\pi f T_D} + \frac{1}{2}\hat{D}(f)\right)Z(f) + \left(\frac{1 + j\alpha}{2}e^{-j2\pi f T_D} - \frac{1}{2}\hat{D}(f)\right)Z^*(-f) \quad \text{(Eq. 27)}$$

$$= W_1(f)Z(f) + W_2(f)Z^*(-f)$$

The Eq. 27 shows a mathematical model for the CVC, and the IRR for the CVC can be calculated. Using the Eq. 27, the RVC can be expressed as an equivalent CVC. After the RVC is written in a form equivalent to a CVC, the IRR of the RVC can be calculated in an analogous manner as discussed above. The input and the output of the RVC can be written in an analogous form. $W_1(f)$ and $W_1(f)$ are a function of parameters used in the RVC. The IRR of the RVC can be computed using the Eq. 27 as well.

Figure 8:
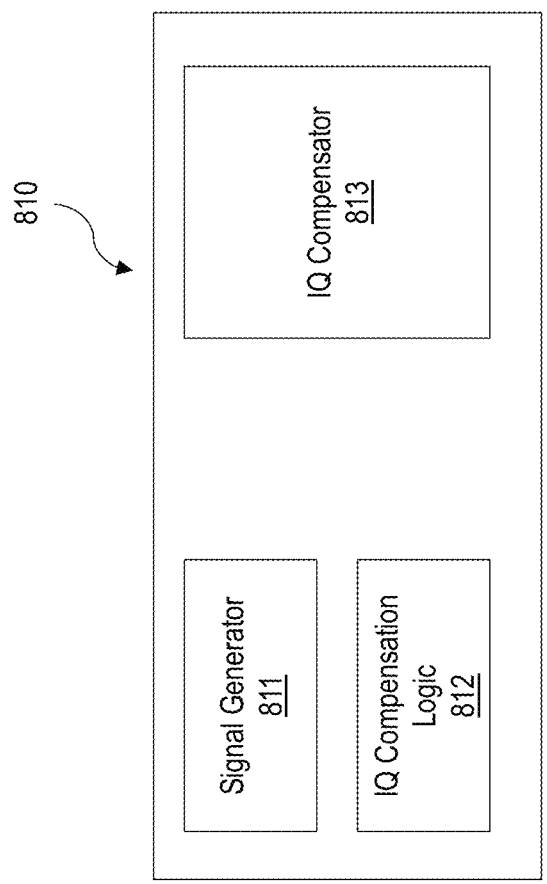
FIG. 8 shows a block diagram of an example IQMC system, according to one embodiment.

FIG. 8 shows a block diagram of an example IQMC system, according to one embodiment. The IQMC system 810 includes a signal generator 811, an IQ compensation logic 812, and an IQ compensator 813. According to one embodiment, the IQ compensator 813 can implement a delay block and a compensation filter including a plurality of time-domain filter taps as shown in FIG. 1. The IQ compensation logic may be implemented with a hardware digital signal processing chip or in a firmware of a receiver in a wireless communication system.

According to one embodiment, the IQ compensation logic 812 provides a static calibration of the IQ compensator 813. The signal generator 811 is configured to generate a single tone signal. According to one embodiment, the IQ compensation logic 812 determines a frequency of the single tone signal and instructs the signal generator 811 to send the single tone signal of the selected frequency. The signal generator 811 may send a series of single tone signals to the IQMC system by sweeping the frequency over a predetermined range of frequencies. The IQ compensation logic 812 receives an impaired signal in response to each of the series of single tone signals, determines an estimate of a frequency response of the compensation filter, and converts the estimated frequency response of the compensation filter into a time-domain response to determine optimal time-domain filter taps of the compensation filter. The IQ compensation logic 812 further analyzes an overall frequency response of the impaired signal over the predetermined range of frequencies. Using the overall frequency response of the impaired signal, the IQ compensation logic 812 determines an optimal time delay of the delay block and coefficients of the filter taps of the compensation filter of the IQ compensator 813. For example, the IQ compensation logic 812 generates a time-to-frequency conversion matrix and converts the frequency response of the compensation filter to a time-domain response using a pseudo-inverse of the time-to-frequency conversion matrix.

According to one embodiment, the IQ compensation logic 812 provides an adaptive calibration of the IQ compensator 813 to optimize the time delay of the delay block and the filter taps of the compensation filter of the IQ compensator 813. The IQ compensation logic 812 repeats the static calibration of the IQ compensator 813 using a plurality of delay values with the same set of single tone signals. The IQ compensation logic 813 determines an optimal delay that provides a minimal least square error (LSE) among the plurality of delay values.

According to one embodiment, a method for providing IQ mismatch (IQMM) compensation includes: sending a single tone signal at an original frequency; determining a first response of an impaired signal at the original frequency and a second response of the impaired signal at a corresponding image frequency; determining an estimate of a frequency response of a compensation filter at the original frequency based on the first response and the second response; repeating the steps of sending the single tone signal, determining the first response and the second response, and determining the estimate of the frequency response of the compensation filter by sweeping the single tone signal at a plurality of steps to determine a snapshot of the frequency response of the compensation filter; converting the frequency response of the compensation filter to a plurality of time-domain filter taps of the compensation filter by performing a pseudo-inverse of a time-to-frequency conversion matrix; and determining a time delay that provides a minimal least square error (LSE) based on a plurality of LSEs for the corresponding time domain filter taps.

The time-to-frequency conversion matrix may be obtained by performing a discrete time Fourier (DFT) on the snapshot of the frequency response of the compensation filter.

The method may further include selecting a finite number of filter taps among the plurality of time-domain filter taps.

The finite number of filter taps may include one or more positive filter taps.

The method may further include adding an extra time delay in a feedforward path of the compensation filter to include a negative filter tap.

The compensation filter may be a complex-valued filter.

The compensation filter may be a real-valued filter including a real-valued scaling factor that feeds a delayed version of an in-phase (I) path into an output of a real-valued filter of a quadrature (Q) path.

The compensation filter may be implemented in a receiver of a wireless communication system.

The compensation filter may include a baseband digital filter.

The method may further include: estimating filter coefficients for the plurality of time-domain filter taps before reception of normal signals based on a static calibration scheme; setting each of the plurality of time-domain filter taps with a corresponding estimated filter coefficient; setting an initial value for a time delay tap to zero or based on an estimated value obtained using the static calibration scheme; and estimating a filter coefficient for the time delay tap using a normal signal based on an iterative scheme using an adaptive filter.

According to one embodiment, a method for providing IQ mismatch (IQMM) compensation includes: estimating filter coefficients corresponding to a plurality of filter taps of a compensation filter before reception of normal signals based on a static calibration scheme; setting each of the plurality of filter taps with a corresponding estimated filter coefficient; setting an initial value for a time delay tap to zero or based an estimated value obtained using the static calibration scheme; and estimating a filter coefficient for the time delay tap during reception of a normal signal based on an iterative scheme using an adaptive filter.

The IQMM may be a frequency-dependent IQMM (FD-IQMM) or a frequency-independent IQMM (FI-IQMM).

The compensation filter may be a complex-valued filter.

The compensation filter may be a real-valued filter including a real-valued scaling factor that feeds a delayed version of an in-phase (I) path into an output of a real-valued filter of a quadrature (Q) path.

The compensation filter may be implemented in a receiver of a wireless communication system.

The compensation filter may include a baseband digital filter.

According to one embodiment, an apparatus includes: a signal generator for generating and sending a single tone signal at an original frequency; a compensator including a time delay and a plurality of time-domain filter taps; and a compensation logic for performing a static calibration of the compensator. The compensation logic is configured to: determine a first response of an impaired signal at the original frequency and a second response of the impaired signal at a corresponding image frequency; determine an estimate of a frequency response of a compensation filter at the original frequency based on the first response and the second response; repeat the steps of sending the single tone signal, determining the first response and the second response, and determining the estimate of the frequency response by sweeping the single tone signal at a plurality of steps to determine a snapshot of the frequency response of the compensation filter; convert the frequency response of the compensation filter to a plurality of time-domain filter taps of the compensation filter by performing a pseudo-inverse of a time-to-frequency conversion matrix; and determining a time delay that provides a minimal least square error (LSE) based on a plurality of LSEs for the corresponding time domain filter taps.

The compensation logic may further be configured to select a finite number of filter taps among the plurality of time-domain filter taps.

The finite number of filter taps may include one or more positive filter taps.

The compensation logic may further be configured to add an extra time delay in a feedforward path of the compensation filter to include a negative filter tap.

The compensation filter may be a complex-valued filter.

The compensation filter may be a real-valued filter including a real-valued scaling factor that feeds a delayed version of an in-phase (I) path into an output of a real-valued filter of a quadrature (Q) path.

The compensation logic may further be configured to: estimate filter coefficients for the plurality of time-domain filter taps before reception of normal signals based on a static calibration scheme; set each of the plurality of time-domain filter taps with a corresponding estimated filter coefficient; set an initial value for a time delay tap to zero or based on an estimated value obtained using the static calibration scheme; and estimate a filter coefficient for the time delay tap using a normal signal based on an iterative scheme using an adaptive filter.

The above example embodiments have been described hereinabove to illustrate various embodiments of implementing a system and method for providing an IQ mismatch calibration and compensation. Various modifications and departures from the disclosed example embodiments will occur to those having ordinary skill in the art. The subject matter that is intended to be within the scope of the present disclosure is set forth in the following claims.

What is claimed is:

1. A method for providing IQ mismatch (IQMM) compensation, the method comprising:
    sending a single tone signal at an original frequency;
    determining a first response of an impaired signal at the original frequency and a second response of the impaired signal at a corresponding image frequency;
    determining an estimate of a frequency response of a compensation filter at the original frequency based on the first response and the second response;
    repeating the steps of sending the single tone signal, determining the first response and the second response, and determining the estimate of the frequency response of the compensation filter by sweeping the single tone signal at a plurality of steps to determine a snapshot of the frequency response of the compensation filter;
    converting the frequency response of the compensation filter to a plurality of time-domain filter taps of the compensation filter by performing a pseudo-inverse of a time-to-frequency conversion matrix; and
    determining a time delay that provides a minimal least square error (LSE) based on a plurality of LSEs for the corresponding time domain filter taps.

2. The method of claim 1, wherein the time-to-frequency conversion matrix is obtained by performing a discrete time Fourier (DFT) on the snapshot of the frequency response of the compensation filter.

3. The method of claim 1, further comprising selecting a finite number of filter taps among the plurality of time-domain filter taps.

4. The method of claim 3, wherein the finite number of filter taps includes one or more positive filter taps.

5. The method of claim 4, further comprising adding an extra time delay in a feedforward path of the compensation filter to include a negative filter tap.

6. The method of claim 1, wherein the compensation filter is a complex-valued filter.

7. The method of claim 1, wherein the compensation filter is a real-valued filter including a real-valued scaling factor that feeds a delayed version of an in-phase (I) path into an output of a real-valued filter of a quadrature (Q) path.

8. The method of claim 1, wherein the compensation filter is implemented in a receiver of a wireless communication system.

9. The method of claim 1, wherein the compensation filter includes a baseband digital filter.

10. The method of claim 1, further comprising:
estimating filter coefficients for the plurality of time-domain filter taps before reception of normal signals based on a static calibration scheme;
setting each of the plurality of time-domain filter taps with a corresponding estimated filter coefficient;
setting an initial value for a time delay tap to zero or based on an estimated value obtained using the static calibration scheme; and
estimating a filter coefficient for the time delay tap using a normal signal based on an iterative scheme using an adaptive filter.

11. An apparatus comprising:
a signal generator for generating and sending a single tone signal at an original frequency;
a compensator including a time delay and a plurality of time-domain filter taps; and
a compensation logic for performing a static calibration of the compensator,
wherein the compensation logic is configured to:
determine a first response of an impaired signal at the original frequency and a second response of the impaired signal at a corresponding image frequency;
determine an estimate of a frequency response of a compensation filter at the original frequency based on the first response and the second response;
repeat the steps of sending the single tone signal, determining the first response and the second response, and determining the estimate of the frequency response by sweeping the single tone signal at a plurality of steps to determine a snapshot of the frequency response of the compensation filter;
convert the frequency response of the compensation filter to a plurality of time-domain filter taps of the compensation filter by performing a pseudo-inverse of a time-to-frequency conversion matrix; and
determining a time delay that provides a minimal least square error (LSE) based on a plurality of LSEs for the corresponding time domain filter taps.

12. The apparatus of claim 11, wherein the compensation logic is further configured to select a finite number of filter taps among the plurality of time-domain filter taps.

13. The apparatus of claim 12, wherein the finite number of filter taps includes one or more positive filter taps.

14. The apparatus of claim 13, wherein the compensation logic is further configured to add an extra time delay in a feedforward path of the compensation filter to include a negative filter tap.

15. The apparatus of claim 11, wherein the compensation filter is a complex-valued filter.

16. The apparatus of claim 11, wherein the compensation filter is a real-valued filter including a real-valued scaling factor that feeds a delayed version of an in-phase (I) path into an output of a real-valued filter of a quadrature (Q) path.

* * * * *